United States Patent [19]
Kawata

[11] Patent Number: 6,038,015
[45] Date of Patent: Mar. 14, 2000

[54] ELECTRON-BEAM PROJECTION-EXPOSURE APPARATUS WITH INTEGRATED MASK INSPECTION AND CLEANING PORTIONS

[75] Inventor: Shintaro Kawata, Kitasouma-gun, Japan

[73] Assignee: Nikon Corporation, Tokyo, Japan

[21] Appl. No.: 09/021,598

[22] Filed: Feb. 10, 1998

[30] Foreign Application Priority Data

Feb. 10, 1997 [JP] Japan ..................................... 9-026739

[51] Int. Cl.$^7$ .............................. G03B 27/54; A61N 5/00
[52] U.S. Cl. .......................................... 355/67; 250/492.2
[58] Field of Search ....................... 355/53, 67; 356/399, 356/400, 401; 250/548, 491.1, 492.2, 492.23, 559.3; 382/144, 149; 430/296; 438/674; 219/121.82

[56] References Cited

U.S. PATENT DOCUMENTS

| | | | |
|---|---|---|---|
| 4,980,536 | 12/1990 | Asch et al. | 219/121.82 |
| 5,043,299 | 8/1991 | Chang et al. | 438/674 |
| 5,798,196 | 8/1998 | Okino | 430/296 |
| 5,799,104 | 8/1998 | Nakamura et al. | 382/144 |
| 5,892,237 | 4/1999 | Kawakami et al. | 250/491.1 |

*Primary Examiner*—David M. Gray
*Assistant Examiner*—Peter B. Kim
*Attorney, Agent, or Firm*—Klarquist Sparkman Campbell Leigh & Whinston, LLP

[57] ABSTRACT

Electron-beam projection-exposure apparatus are disclosed that allow a mask pattern to be transferred to a sensitized substrate without defects. An apparatus includes an electron-beam scanner, housed in a vacuum chamber, that scans an electron beam over the mask. As the mask is scanned, an emitted-electron detector senses electrons emitted from the mask at a point of contamination. The contamination is then removed from the mask by a mask-cleaning system, after which the mask is used for exposing a sensitized substrate. The scanner as well as the mask-cleaning system are housed in the same vacuum chamber where projection-exposure of the substrate are performed. Thus, the mask is not exposed to the external environment during inspection, cleaning, and projection-exposure, and inspection, cleaning and projection-exposure of the mask are performed more rapidly than conventionally. The mask-cleaning system, which can utilize a laser beam or a locally delivered reactive gas, cleans the mask at only the points of contamination, rather than the entire mask. Thus, cleaning time is shortened.

38 Claims, 3 Drawing Sheets

ELECTRON-BEAM PROJECTION-EXPOSURE APPARATUS WITH INTEGRATED MASK INSPECTION AND CLEANING PORTIONS

FIELD OF THE INVENTION

This invention pertains to electron-beam-projection-exposure apparatus used for transferring a mask pattern formed on a mask to a sensitized substrate, and more particularly pertains to such systems that can detect and remove contamination from the mask.

BACKGROUND OF THE INVENTION

Electron-beam-projection-exposure apparatus use an electron beam to transfer a mask image onto a sensitized wafer or other substrate. Such apparatus are important in the manufacture of electronic devices, particularly integrated circuits and displays.

Electron-beam-projection-exposure apparatus are extremely sensitive to contaminants, such as particles, metallic ions, chemicals, and bacteria. Many of these contaminants can be deposited on the wafer or mask during fabrication and can ultimately cause the failure of integrated circuits that are subsequently produced. Fabrication plants take extensive precautions to ensure that levels of contaminants in the fabrication area are reduced. For example, adhesive floor mats are used to strip particles from workers' shoes, the workers wear special contamination-preventing clothing, and air showers are used to blow contaminants off of the clothing before the workers enter the fabrication area. Nevertheless, certain levels of contaminants remain in the fabrication area.

Inspection devices have been developed for detecting such contaminants adhered to a mask. If the inspection device detects contamination, the mask is transferred to a contaminant-cleaning device. After the mask is cleaned, it can be returned to the electron-beam-projection-exposure apparatus for exposing sensitized wafers. Conventionally, the inspection device, cleaning device, and the electron-beam-projection-exposure apparatus are all independent from each other so that the mask must be exposed to an external environment as the mask is moved from one device to the next. Consequently, even though the inspection device detects contamination, new contamination can become attached to the mask after the mask is moved to the cleaning device. After the mask is cleaned, still more contamination can become attached to the mask en route to the projection-exposure apparatus. Transferring the mask between independent inspection, cleaning, and projection-exposure apparatus also causes long delays, thereby further increasing the possibility of contaminants adhering to the mask.

Recently developed inspection devices may cause even further delays. For example, mask patterns used to generate submicron line widths require an inspection device with high resolution, such as a scanning electron microscope. Such high-resolution devices require inspection in a vacuum, which further slows the process and increases the likelihood of contamination.

SUMMARY OF THE INVENTION

In view of the shortcomings discussed above, an object of this invention is to provide an electron-beam-projection-exposure apparatus that can quickly scan a mask for contamination, remove the contamination, and subsequently project and expose the mask pattern onto a sensitized substrate with little or no exposure defects.

An electron-beam-projection-exposure apparatus according to a preferred embodiment of the invention comprises an electron-beam illumination device, a scanner, and an emitted-electron detector. The electron-beam illumination device is situated so as to illuminate an electron beam onto a mask. The scanner is situated so as to scan the electron beam over the mask. The "emitted-electron detector" is situated so as to detect electrons (such as backscattered electrons, and/or secondary electrons, etc.) that are emitted from the mask as the mask is illuminated by the electron beam.

The apparatus can further comprise a mask-cleaning system for removing the contamination detected by the emitted-electron detector. The mask-cleaning system preferably cleans the mask only at detected points of contamination. To such end, the mask-cleaning system can comprises a pulse laser that irradiates a pulse laser beam at points of contamination on the mask. The laser can be connected to and controlled by a laser controller which controllably causes the laser to direct a laser pulse at a specific location on the mask at which a contaminant was detected. Alternatively, the mask-cleaning system can comprise a conduit for directing an amount of a reactive gas from a supply to the points of contamination on the mask. Discharge of the gas can be regulated by a controller that functions in a manner analogous to the laser controller.

The apparatus is preferably housed in a single vacuum chamber. The vacuum chamber preferably comprises an electron-beam-exposure portion in which the mask pattern is transferred onto a sensitized substrate using an electron beam, and a cleaning portion in which contamination is removed from the mask. Thus, the electron-beam-exposure portion preferably houses the electron-beam illumination device, the scanner, and the emitted-electron detector.

The apparatus can also comprise a movable mask stage for supporting the mask, and a stage driver for moving the mask stage between the electron-beam-exposure portion and the cleaning portion of the vacuum chamber.

The apparatus preferably comprises a contamination-inspection-data analysis system ("analyzer") connected to the emitted-electron detector. When a contaminant is detected at a location on the mask by the emitted-electron detector, the analyzer determines the coordinates of the location. The coordinates can be stored in a memory for later recall, such as by a laser controller.

According to another aspect of the invention, methods are provided for removing contamination from a mask, and for transferring the mask pattern onto a sensitized substrate after the contamination is removed from the mask. In a preferred embodiment of the method, an electron beam is projected onto the mask when the mask is at a first position. Electrons of the beam that are emitted from the mask at a point of contamination on the mask are detected. Positional coordinates of the point of contamination on the mask are determined (and can be stored in a memory), based on the detected emitted electrons. The mask is then cleaned at the point of contamination. After cleaning the mask, the mask is illuminated with an electron beam to projection-transfer the mask pattern onto a sensitized substrate. Cleaning the mask can be performed by moving the mask to a second position, at which the positional coordinates, preferably recalled from the memory, are used to direct localized cleaning of the mask. The localized cleaning can be performed by controlled exposure of the location to a laser pulse (e.g., from a KrF excimer laser), or to an amount of a reactive gas (e.g., ozone) discharged at the location.

By performing contaminant detection, mask cleaning, and projection-exposure in a single chamber, the mask is not exposed to an external environment between inspection, cleaning, and projection-exposure. Also, inspection, cleaning, and projection-exposure are completed much faster than with conventional apparatus and methods. Also, because the mask is cleaned only at locations where contamination is present, rather than the entire mask, mask-cleaning time is substantially reduced.

The foregoing and other objects, features, and advantages of the invention will become more apparent from the following detailed description of preferred embodiments which proceeds with reference to the accompanying drawings.

DETAILED DESCRIPTION OF THE PREFERRED EMBODIMENTS

Figure 1:
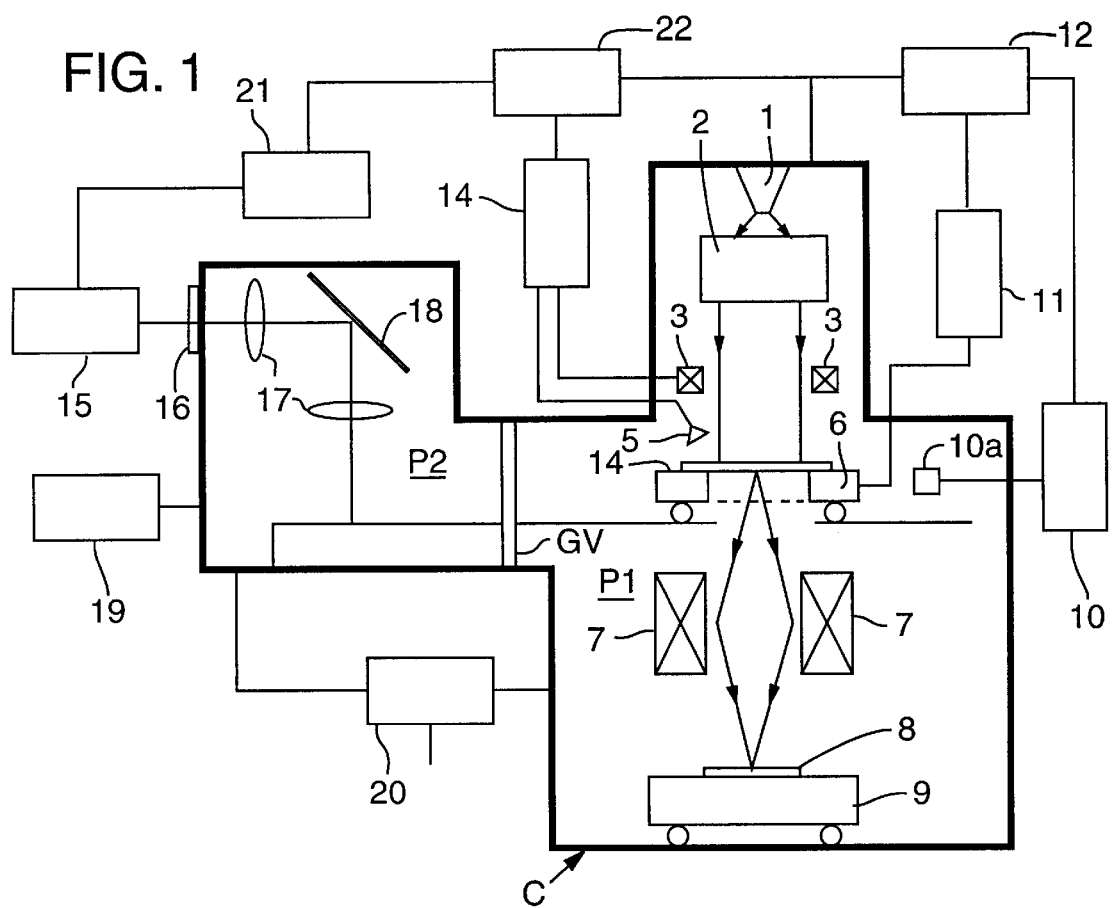
FIG. 1 is an elevational, schematic view of an electron-beam-projection-exposure apparatus including an electron-beam-exposure portion and a cleaning portion according to one embodiment of the invention.

FIG. 1 shows an electron-beam-exposure apparatus according to a preferred embodiment of the present invention. The electron-beam-exposure apparatus is housed within a vacuum chamber C that comprises an electron-beamexposure portion P1 and a cleaning portion P2. The portions P1 and P2 are separated by a gate valve GV or analogous appliance. With the gate valve GV in an open position, the portions P1 and P2 form a single chamber, and with the gate valve in a closed position, the portions P1 and P2 are isolated from each other. The electron-beam-exposure portion P1 is used for detecting contamination and for transferring a mask pattern onto a sensitized substrate. The cleaning portion P2 is used for cleaning contamination from a mask, as further described below.

The electron-beam-exposure portion P1 houses the following components: an electron-beam-generation device ("e-beam generator") 1, an electron-beam-zoom-illumination system ("illumination system") 2, a deflector 3, a mask 4 (preferably a stencil mask), an emitted-electron detector 5 (preferably a back-scattered electron detector), a mask stage 6, a projection lens 7, a wafer 8 (or other suitable substrate), and a wafer stage 9. The e-beam generator 1 comprises an electron gun that produces an electron beam for detecting contamination in a contamination-inspection mode and for transferring the pattern defined by the mask 4 onto the wafer 8 in a projection-exposure mode.

The illumination system 2 and the deflector 3 define a "scanner" for detecting contamination. Specifically, the illumination system 2 focuses the electron beam emitted from the e-beam generator 1 to a required angle. The deflector 3 is used in conjunction with the illumination system 2 to cause the constricted electron beam to scan the mask 4. The emitted-electron detector 5 (preferably a back-scattered electron detector) detects electrons that are emitted (e.g., backscattered) from the mask 4 as a result of the mask being illuminated by the electron beam. The mask stage 6 is movable between the electron-beam-exposure portion P1 and the cleaning portion P2 and is used to movably support the mask 4. The projection lens 7 focuses the electron beam after the beam passes through the mask 4 to image the mask pattern on the wafer 8. The wafer stage 9 supports the wafer 8.

An interferometric-measuring device ("interferometer") 10 is coupled to an interferometer head 10a. The interferometer 10 and interferometer head 10a collectively measure the position of the mask stage 6. A stage driver 11 actuates the mask stage 6 so that the stage can be moved between the electron-beam-exposure portion P1 and the cleaning portion P2 of the vacuum chamber C. An exposure controller 12 is coupled to the e-beam generator 1 and controls the projection-exposure of the wafer 8. A contamination-inspection-data-analyzer ("analyzer") 14 is coupled to the emitted-electron detector 5 and are collectively used for detecting contamination.

The cleaning portion P2 houses a laser illumination system 17 and a mirror 18. A laser 15 (preferably a KrF excimer laser) is located adjacent to the cleaning portion P2. An opening 16 in the vacuum chamber C allows laser light from the laser 15 to pass into the cleaning portion P2 while providing an airtight seal to prevent the external atmosphere from entering the vacuum chamber C. The laser illumination system 17 and the mirror 18 are used to condense laser light from the laser 15 and to bend the light so that the light projects onto the mask 4 whenever the mask is positioned for cleaning. A water-vapor vessel 19 supplies water vapor to the cleaning portion P2. An exhaust system 20 removes gas from inside the chamber C. A laser controller 21 controls the operation of the laser 15 during laser cleaning. A memory 22 is coupled to the laser controller 21 and stores information regarding the location of contamination as determined by the analyzer 14.

Figure 2A:
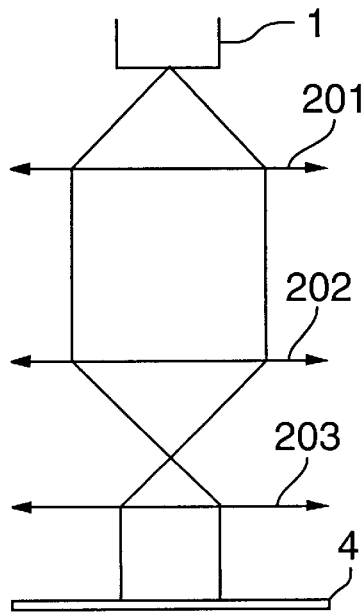
FIG. 2(a) shows an electron-beam-zoom-illumination system used in the FIG. 1 embodiment and configured to transfer a mask pattern onto a sensitized substrate.
Figure 2B:
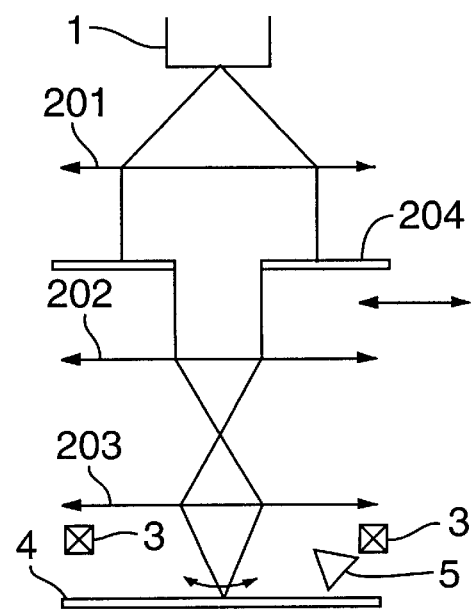
FIG. 2(b) shows the electron-beam-zoom-illumination system of FIG. 2(a) configured to scan the mask pattern for contamination.

FIGS. 2(a) and 2(b) show additional details of the illumination system 2. The illumination system 2 comprises multiple electron lenses 201, 202, 203. During a contamination-inspection mode, a diaphragm 204 is inserted between the lenses 201 and 202 (FIG. 2(b)). The diaphragm defines multiple apertures of different sizes extending therethrough. The appropriate aperture can be selected through which the electron beam is passed to regulate the intensity of the electron beam during the contamination inspection. By controlling the electrical energy supplied to the lenses 202 and 203, the electron beam passing through the selected aperture of the diaphragm 204 is converged to the necessary diameter on the mask 4. Preferably, the electron beam is converged to a diameter that is no more than one-quarter of the width of the mask pattern formed on the mask 4. Such a width allows detection of ontaminant particles having small diameter. After completion of contamination-inspection, the diaphragm 204 is retracted for the projection-exposure mode, as shown n FIG. 2(a).

Figure 3:
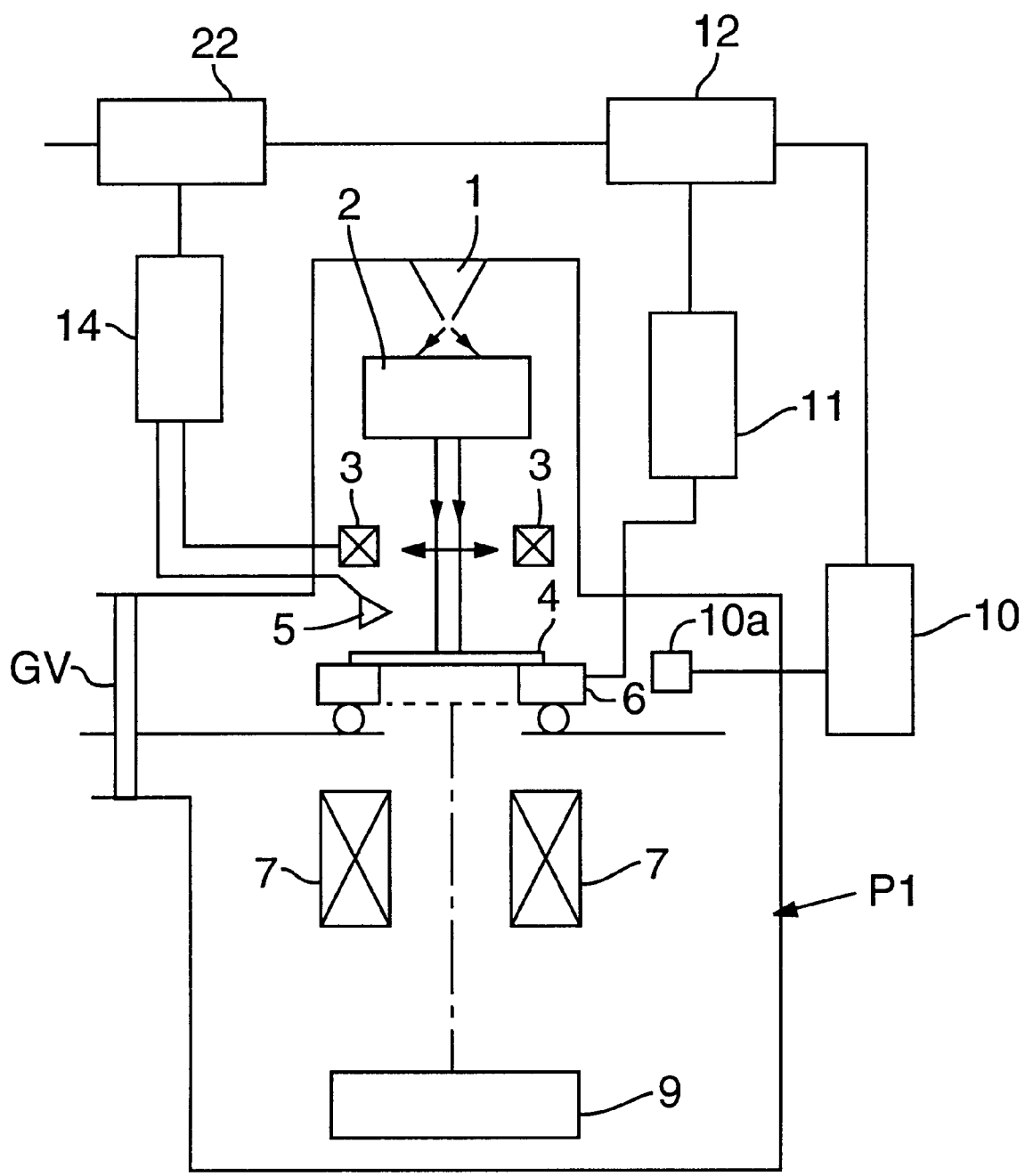
FIG. 3 is a detailed schematic view of the electron-beam-exposure portion of the FIG.-1 apparatus.

FIG. 3 shows the components within the exposure portion P1 during the contamination-inspection mode. Although not shown in FIG. 3, the wafer 8 is coated with an electron-sensitive resist and is placed on the wafer stage 9 for inspection and subsequent exposure. During inspection, the electron beam is blocked so that it does not propagate to the wafer 8. During inspection, the deflector 3 is used to scan the electron beam over only the region of the mask 4 that is used during the projection-exposure mode. The emitted-electron detector 5 detects electrons that are emitted (e.g., back-scattered) from the mask 4 and generates a corresponding output electrical signal that is analyzed by the analyzer 14. The analyzer 14 compares the output signal of the emitted-electron detector 5 with data stored in the memory 22 concerning the mask pattern to determine whether contamination is present on the mask 4. If contamination is detected on the mask 4, the position coordinates of that contamination are calculated and stored in the memory 22.

Figure 4:
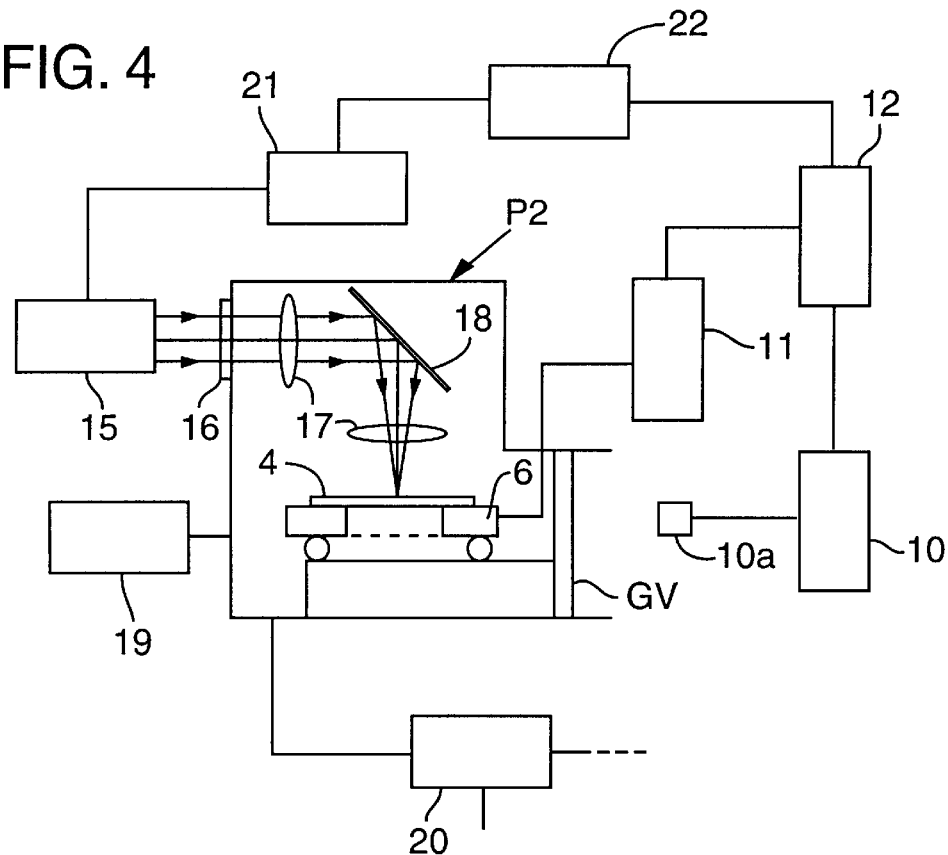
FIG. 4 is an elevational, schematic view of the cleaning portion of the FIG.-1 apparatus.

FIG. 4 shows the cleaning portion of the vacuum chamber C in greater detail. If contamination is detected on the mask 4, the gate valve GV opens and the pressure inside the electron-beam-exposure portion P1 decreases due to the removal of gas from the cleaning portion P2. The mask stage 6 is driven by the stage driver 11 to move the mask 4 into the cleaning portion P2. Because the mask 4 moves to the cleaning portion P2 without contacting the environment outside the vacuum chamber, new contamination is prevented from adhering to the mask after inspection. After transporting the mask 4 into the cleaning portion P2, the gate valve GV closes and water vapor (e.g., 20 Torr) enters the cleaning portion P2 from the water-vapor vessel 19. The mask 4 is then aligned according to the coordinates (stored in the memory 22) at which the contamination is adhering to the mask 4. The position of the mask stage 6 is adjusted as required according to the recalled coordinates such that laser light (e.g., 0.1 J/cm$^2$) from the laser 15 irradiates the mask 4 at the desired coordinates. The incident laser light removes the contamination from the locations on the mask corresponding to the recalled coordinates. The cleaning time is short because the laser light only cleans at the locations at which contamination was detected. When contamination is present at a plurality of locations, further positional adjustments of the mask stage 6 are performed as required to present new locations for irradiation by the laser light.

After all the contamination of the stencil mask 4 is removed, the water vapor of the cleaning portion P2 is discharged by exhaust system 20. The gate valve GV then opens and the mask stage 6 is moved back into the electron-beam-exposure portion P1. Notably, the mask 4 returns to the electron-beam-exposure portion P1 without making contact with the external environment so that the mask is not exposed to new contamination. To prepare for the projection-exposure mode, the diaphragm 204 (FIG. 2(b)) is retracted from the electron beam. Additionally, the illumination lenses 201, 202, 203 are adjusted so that the mask pattern can be accurately projected onto the wafer 8.

If no contamination is detected during the contamination-inspection mode, the diaphragm 204 is retracted from the electron beam and the illumination lenses 201, 202, 203 are adjusted as required to perform the projection-exposure of the wafer as described above. Again, the mask 4 makes no contact with the external environment between inspection and projection-exposure.

Figure 5:
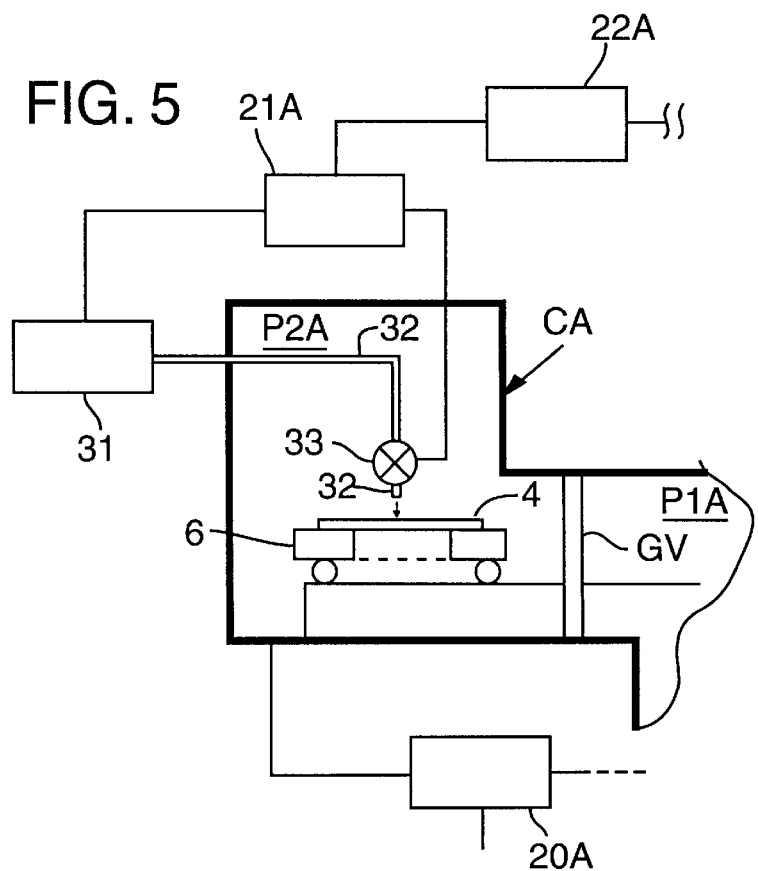
FIG. 5 is an elevational, schematic view of a cleaning portion according to a second embodiment of the invention.

FIG. 5 shows a second embodiment according to the invention. The primary difference between the first and second embodiments is that ozone gas is used instead of laser light to clean the mask 4. In FIG. 5, a chamber CA comprises an electron-beam-exposure portion P1A and an ozone-cleaning portion P2A. A gate valve GV separates the portions P1A and P2A. An ozone tank 31 supplies ozone used for cleaning contamination from the mask 4. An insertion tube or conduit 32 conducts the ozone from the tank 31 to the mask 4. A high-speed valve 33 inserted in the tube 32 controls discharge of the ozone. An exhaust portion 20A removes gas from inside the cleaning portion P2A. An ozone-cleaning controller 21A controls the opening and closing of the high-speed valve 33. A memory 22A stores data in a manner similar to that of the memory 22 of FIG. 1.

Contamination inspection is performed by first placing the mask 4 inside the electron-beam-exposure portion P1A. If mask contamination is detected during contamination inspection, the gate valve GV opens and the mask stage 6 moves the mask 4 to the ozone-cleaning portion P2A. The gate valve GV then closes and the mask stage 6 is aligned such that the detected coordinates of the contamination are aligned with the insertion tube 32. Next, the high-speed valve 33 opens for a moment to discharge the ozone onto the desired location on the mask corresponding to the coordinates so as to remove the contamination therefrom. After all the contamination is removed, the exhaust portion 20A removes the ozone gas from the cleaning portion P2A. The gate valve GV then opens and the mask 4 is transferred to the electron-beam-exposure portion P1A. Subsequently, projection-exposure of the wafer 8 is performed as described in the first embodiment.

The second embodiment provides an advantage over the first embodiment in that water vapor is not used. The second embodiment also permits cleaning a wide area outside the coordinates at which contamination was found. Although ozone is the preferred reactive gas for use in the cleaning operation, a plasma such as oxygen plasma can alternatively be used.

The invention as exemplified by the above-described embodiments allows contamination inspection, cleaning, and projection and exposure of the mask 4 to occur inside a single vacuum chamber C. Consequently, exposure of the mask to contamination is prevented during inspection, cleaning, and exposure of the mask. Additionally, inspection, cleaning, and exposure are completed much faster than in conventional apparatus since all these operations are performed in a single chamber. Further, the time required for cleaning is shortened because the mask is cleaned only at locations where contamination is present.

Although the first embodiment comprises the cleaning portion P2 separate from the electron-beam-exposure portion P1, it will be understood that the mask 4 can be cleaned within the electron-beam-exposure portion P1 at the same position that contamination-inspection occurs. For example, laser light used for cleaning can be irradiated at substantially the same axis as the axis of the electron beam used for projection-exposure. Such irradiation can be performed after or during the contamination-inspection.

Although a KrF excimer laser is preferably used in the first embodiment to clean the mask, a different type of pulse laser, such as another type of excimer laser, a $CO_2$ laser, or a YAG laser can be used.

Furthermore, during contamination-inspection of the mask 4, inspection is not limited to finding defects caused by adhesion of contaminant particles. The inspection can be directed to finding defects such as surficial damage to the mask 4.

Having illustrated and demonstrated the principles of the invention in several embodiments, it should be apparent to those skilled in the art that these embodiments can be modified in arrangement and detail without departing from such principles. I claim as the invention all that comes within the scope of these claims.

What is claimed is:

1. In an electron-beam-exposure apparatus for projecting a mask pattern onto a sensitized substrate, a mask-inspection system comprising:

(a) an electron-beam-generation device situated so as to illuminate an electron beam onto a mask;
(b) an emitted-electron detector situated so as to detect electrons of the electron beam emitted from the mask at a point of contamination on the mask; and
(c) wherein the electron-beam-generation device is used for both detecting contamination on the mask and projecting a mask pattern onto a sensitized substrate.

2. The electron-beam-exposure apparatus of claim 1, further comprising a mask-cleaning system for removing the contamination detected by the emitted-electron detector.

3. The electron-beam-exposure apparatus of claim 2, wherein the mask-cleaning system cleans the mask only at detected points of contamination.

4. The electron-beam-exposure apparatus of claim 2, wherein the mask-cleaning system comprises a pulse laser that irradiates a pulse laser beam at points of contamination on the mask to clean the contamination from the mask at said points.

5. The electron-beam-exposure apparatus of claim 2, wherein the mask-cleaning system comprises a supply of reactive gas from which an amount of the reactive gas is controllably discharged at points of contamination to clean the contamination from the mask at said points.

6. The electron-beam-exposure apparatus of claim 1, further comprising a vacuum chamber comprising an electron-beam-exposure portion in which the mask pattern is transferred onto a sensitized substrate, and a cleaning portion in which contamination is removed from the mask.

7. The electron-beam-exposure apparatus of claim 6, wherein the electron-beam-exposure portion encloses the electron-beam-generation device, the scanner, and the emitted-electron detector.

8. The electron-beam-exposure apparatus of claim 1, wherein the scanner comprises multiple lenses and a diaphragm defining an aperture therethrough, the aperture serving to regulate the intensity of the electron beam passing through the aperture when the electron beam is used to inspect the mask for contamination.

9. The electron-beam-exposure apparatus of claim 8, wherein the electron beam has a predetermined width and the aperture has a diameter of no more than one-fourth the width of the electron beam.

10. The electron-beam-exposure apparatus of claim 1, further comprising:
    a vacuum chamber comprising an electron-beam portion and a cleaning portion, the electron-beam portion enclosing the electron-beam-generation device, the scanner, and the emitted-electron detector;
    a movable mask stage for supporting the mask; and
    a stage-driver for moving the mask stage between the electron-beam and cleaning portions of the vacuum chamber.

11. The electron-beam-exposure apparatus of claim 1, further comprising a contamination-inspection-data-analysis system connected to the emitted-electron detector for determining coordinates of each detected point of contamination of the mask.

12. The electron-beam-exposure apparatus of claim 11, further comprising:
    a laser-cleaning controller connected to the contamination-inspection-data-analysis portion; and
    an excimer laser connected to and responsive to the laser-cleaning controller for irradiating laser light onto the mask at detected points of contamination as determined by the contamination-inspection-data-analysis portion.

13. The electron-beam-exposure apparatus of claim 1, further comprising:
    a wafer stage for supporting a sensitized substrate; and
    a projection lens that focuses the electron beam after the electron beam has passed through the mask for projecting the mask pattern onto a sensitized substrate.

14. A method for removing contamination from a mask having a defined mask pattern and for transferring the mask pattern onto a sensitized substrate after the contamination is removed, the method comprising the steps:
    (a) at a first position of the mask, projecting an electron beam onto the mask using an electron beam source;
    (b) detecting electrons of the electron beam that are emitted from a point of contamination on the mask;
    (c) determining positional coordinates of the point of contamination on the mask based on the detected emitted electrons
    (d) cleaning the mask at the point of contamination; and
    (e) after cleaning the mask, illuminating an electron beam onto the mask using the same electron beam source to projection-transfer the mask pattern onto a sensitized substrate.

15. The method of claim 14, further comprising the step of recording the positional coordinates in a memory.

16. The method of claim 14, wherein step (d) further comprises:
    moving the mask to a second position for cleaning the mask;
    recalling the positional coordinates of the point of contamination from the memory; and
    aligning the mask according to the recalled positional coordinates so that the point of contamination can be exposed to a cleaning agent to remove the contamination from the point of contamination.

17. The method of claim 16, wherein the cleaning agent is light is from an excimer laser.

18. The method of claim 16, wherein the cleaning agent is ozone gas.

19. The method of claim 14, wherein:
    the electron beam is projected through multiple lenses, and
    step (b) comprises regulating the intensity of the electron beam by passing the electron beam through an aperture defined by a diaphragm.

20. The method of claim 14, wherein step (c) comprises comparing an output of the emitted-electron detector to a stored pattern to find discrepancies between the output and the stored pattern.

21. An electron-beam-exposure apparatus for projecting a mask pattern onto a photosensitive substrate, comprising:
    (a) an electron gun that produces an electron beam;
    (b) an electron-beam-zoom-illumination system situated so as to illuminate the electron beam emitted from the electron gun onto a mask defining the mask pattern;
    (c) a mask stage for supporting the mask;
    (d) a deflector
    (e) an emitted-electron detector situated so as to detect electrons from the electron beam that are emitted from the mask; and
    (f) a contamination-inspection-data analyzer connected to the emitted-electron detector for comparing data received from the electron detector to stored data concerning the topography of the mask to determine if contamination is present at any of various locations within the region;

(g) wherein the electron gun is used for detecting contamination and for projecting the mask pattern onto the photosensitive substrate.

22. The electron-beam-exposure apparatus of claim 21, further comprising a laser connected to and responsive to the contamination-inspection-data analyzer, the laser directing a pulse of laser light at a location at which contamination was determined by the contamination-inspection-data analyzer.

23. The electron-beam-exposure apparatus of claim 21, further comprising a tank for storing a reactive gas, a discharge tube coupled to the tank, a valve connected to the discharge tube for controlling release of the gas from the tank, and a controller connected to the valve, wherein the controller opens and closes the valve in response to the contamination-inspection-data analyzer for applying the gas to a location on the mask so as to remove contamination from the location on the mask as detected by the contamination-inspection-data analyzer.

24. The electron-beam-exposure apparatus of claim 21, further comprising a cleaning system for cleaning the mask at a point of contamination.

25. The electron-beam-exposure apparatus of claim 24, further comprising a vacuum chamber in which projection-exposure of the sensitive substrate is performed, wherein the electron-beam-zoom-illumination system, the deflector, and the cleaning system are housed in the vacuum chamber.

26. The electron-beam-exposure apparatus of claim 21, further comprising a cleaning system connected to and responsive to the contamination-inspection-data analyzer, wherein the cleaning system cleans the mask only at points of detected contamination.

27. The electron-beam-exposure apparatus of claim 26, wherein the cleaning system comprises a pulse laser situated so as to controllably direct a pulse of laser light at the points of contamination.

28. The electron-beam-exposure apparatus of claim 26, wherein the cleaning system comprises a conduit and a valve connectable to a supply of reactive gas, the conduit being situated so as to controllably direct an amount of the reactive gas from the supply to the points of contamination.

29. The electron-beam-exposure apparatus of claim 21, wherein the electron-beam-zoom-illumination system comprises multiple lenses aligned in series through which the electron beam passes, and a diaphragm defining at least one aperture sized for regulating the intensity of the electron beam passing through the aperture.

30. The electron-beam-exposure apparatus of claim 29, wherein the electron beam has a predetermined diameter and the electron-beam-zoom-illumination system reduces the diameter of the electron beam to no more than one-quarter of a width of the mask pattern.

31. An electron-beam-exposure apparatus for projecting a mask pattern onto a sensitized substrate, comprising:

(a) means for illuminating an electron beam onto a mask and for scanning the electron-beam over the mask;

(b) means for detecting contamination by sensing electrons of the electron-beam emitted from the mask at a point of contamination on the mask; and (c) wherein the means for illuminating used for detecting contamination are the same means for projecting a mask pattern onto a sensitized substrate.

32. The electron-beam-exposure apparatus of claim 31 further including means for cleaning the mask only at the point of contamination.

33. The electron-beam-exposure apparatus of claim 32 further including means for projecting the mask pattern onto the sensitized substrate.

34. The electron-beam-exposure apparatus of claim 33 further including a vacuum chamber, wherein the means for illuminating, means for scanning, means for detecting, means for cleaning, and means for projecting are all situated within the vacuum chamber.

35. The electron-beam-exposure apparatus of claim 1, further including at least one lens situated between the electron-beam-generation device and the mask, wherein the at least one lens is used for both detecting contamination and projecting the mask pattern onto the sensitized substrate.

36. The method of claim 14, further including at least one lens situated between the electron-beam-generation device and the mask, wherein the at least one lens is used for both detecting contamination and projecting the mask pattern onto the sensitized substrate.

37. The electron-beam-exposure apparatus of claim 21, further including at least one lens situated between the electron-beam-generation device and the mask, wherein the at least one lens is used for both detecting contamination and projecting the mask pattern onto the sensitized substrate.

38. The electron-beam-exposure apparatus of claim 31, further including at least one lens situated between the electron-beam-generation device and the mask, wherein the at least one lens is used for both detecting contamination and projecting the mask pattern onto the sensitized substrate.

\* \* \* \* \*

UNITED STATES PATENT AND TRADEMARK OFFICE
CERTIFICATE OF CORRECTION

PATENT NO.   : 6,038,015
DATED        : March 14, 2000
INVENTOR(S)  : Shintaro Kawata Page 1 of 1

It is certified that error appears in the above-identified patent and that said Letters Patent is hereby corrected as shown below:

Column 3, line 41, "beamexposure" should be —beam-exposure—.

Column 4, line 56, "ontaminant" should be —contaminant—.

Column 4, line 59, "shown n" should be —shown in—.

Signed and Sealed this

Fifth Day of June, 2001

NICHOLAS P. GODICI

Attest:

Attesting Officer

Acting Director of the United States Patent and Trademark Office